(12) United States Patent
Kraft et al.

(10) Patent No.: US 7,859,047 B2
(45) Date of Patent: Dec. 28, 2010

(54) SHIELDED GATE TRENCH FET WITH THE SHIELD AND GATE ELECTRODES CONNECTED TOGETHER IN NON-ACTIVE REGION

(75) Inventors: Nathan Kraft, Pottsville, PA (US); Christopher Boguslaw Kocon, Mountaintop, PA (US); Paul Thorup, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 156 days.

(21) Appl. No.: 12/268,616

(22) Filed: Nov. 11, 2008

(65) Prior Publication Data

US 2009/0057754 A1 Mar. 5, 2009

Related U.S. Application Data

(60) Continuation of application No. 11/938,583, filed on Nov. 12, 2007, now Pat. No. 7,473,603, which is a division of application No. 11/471,279, filed on Jun. 19, 2006, now Pat. No. 7,319,256.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ................ 257/330; 257/331; 257/E29.201
(58) Field of Classification Search ................ 257/330, 257/331, 332, E27.091, E29.201, E21.655
See application file for complete search history

(56) References Cited

U.S. PATENT DOCUMENTS 3,404,295 A 10/1968 Warner et al.
3,412,297 A 11/1968 Amlinger (Continued)

FOREIGN PATENT DOCUMENTS

CN 1036666 10/1989

(Continued)

OTHER PUBLICATIONS

"CoolMOS the second generation," Infineon Technologies Product Information, 2 pages total, (2000).

(Continued)

*Primary Examiner*—Hoai v Pham
(74) *Attorney, Agent, or Firm*—Townsend and Townsend and Crew LLP

(57) ABSTRACT

A field effect transistor (FET) includes a plurality of trenches extending into a semiconductor region. Each trench includes a gate electrode and a shield electrode with an inter-electrode dielectric therebetween. A body region extends between each pair of adjacent trenches, and source regions extend in each body region adjacent to the trenches. A first interconnect layer contacts the source and body regions. The plurality of trenches extend in an active region of the FET, and the shield electrode and gate electrode extend out of each trench and into a non-active region of the FET where the shield electrodes and gate electrodes are electrically connected together by a second interconnect layer. The electrical connection between the shield and gate electrodes is made through periodic contact openings formed in a gate runner region of the non-active region.

5 Claims, 5 Drawing Sheets

U.S. PATENT DOCUMENTS

| | | |
|---|---|---|
| 3,497,777 A | 2/1970 | Teszner et al. |
| 3,564,356 A | 2/1971 | Wilson |
| 3,660,697 A | 5/1972 | Berglund et al. |
| 4,003,072 A | 1/1977 | Matsushita et al. |
| 4,011,105 A | 3/1977 | Paivinen et al. |
| 4,300,150 A | 11/1981 | Colak |
| 4,324,038 A | 4/1982 | Chang et al. |
| 4,326,332 A | 4/1982 | Kenney et al. |
| 4,337,474 A | 6/1982 | Yukimoto |
| 4,338,616 A | 7/1982 | Bol |
| 4,345,265 A | 8/1982 | Blanchard |
| 4,445,202 A | 4/1984 | Geotze et al. |
| 4,568,958 A | 2/1986 | Baliga |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,673,962 A | 6/1987 | Chatterjee et al. |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga |
| 4,967,245 A | 10/1990 | Cogan et al. |
| 4,969,028 A | 11/1990 | Baliga |
| 4,974,059 A | 11/1990 | Kinzer |
| 4,982,260 A | 1/1991 | Chang et al. |
| 4,990,463 A | 2/1991 | Mori |
| 4,992,390 A | 2/1991 | Chang |
| 5,023,196 A | 6/1991 | Johnsen et al. |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,111,253 A | 5/1992 | Korman et al. |
| 5,126,807 A | 6/1992 | Baba et al. |
| 5,134,448 A | 7/1992 | Johnsen et al. |
| 5,142,640 A | 8/1992 | Iwanatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,294,824 A | 3/1994 | Okada |
| 5,298,781 A | 3/1994 | Cogan et al. |
| 5,300,447 A | 4/1994 | Anderson |
| 5,300,452 A | 4/1994 | Chang et al. |
| 5,326,711 A | 7/1994 | Malhi |
| 5,346,834 A | 9/1994 | Hisamoto et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,449,925 A | 9/1995 | Baliga et al. |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,179 A | 7/1996 | Chang et al. |
| 5,541,425 A | 7/1996 | Nishihara |
| 5,554,552 A | 9/1996 | Chi et al. |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyed et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,614,749 A | 3/1997 | Ueno |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,283 A | 7/1997 | Tsang et al. |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi et al. |
| 5,719,409 A | 2/1998 | Singh et al. |
| 5,721,148 A | 2/1998 | Nishimura |
| 5,744,372 A | 4/1998 | Bulucea |
| 5,767,004 A | 6/1998 | Balasubramanian et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,821,583 A | 10/1998 | Hshieh et al. |

| | | | | | | |
|---|---|---|---|---|---|---|
| 5,877,528 | A | 3/1999 | So | 6,188,105 | B1 | 2/2001 | Kocon et al. |
| 5,879,971 | A | 3/1999 | Witek | 6,190,978 | B1 | 2/2001 | D'Anna |
| 5,879,994 | A | 3/1999 | Kwan et al. | 6,191,447 | B1 | 2/2001 | Baliga |
| 5,894,157 | A | 4/1999 | Han et al. | 6,194,741 | B1 | 2/2001 | Kinzer et al. |
| 5,895,951 | A | 4/1999 | So et al. | 6,198,127 | B1 | 3/2001 | Kocon |
| 5,895,952 | A | 4/1999 | Darwish et al. | 6,201,279 | B1 | 3/2001 | Pfirsch |
| 5,897,343 | A | 4/1999 | Mathew et al. | 6,204,097 | B1 | 3/2001 | Shen et al. |
| 5,897,360 | A | 4/1999 | Kawaguchi | 6,207,994 | B1 | 3/2001 | Rumennik et al. |
| 5,900,663 | A | 5/1999 | Johnson et al. | 6,222,229 | B1 | 4/2001 | Hebert et al. |
| 5,906,680 | A | 5/1999 | Meyerson | 6,222,233 | B1 | 4/2001 | D'Anna |
| 5,907,776 | A | 5/1999 | Hshieh et al. | 6,225,649 | B1 | 5/2001 | Minato |
| 5,917,216 | A | 6/1999 | Floyed et al. | 6,228,727 | B1 | 5/2001 | Lim et al. |
| 5,929,481 | A | 7/1999 | Hsieh et al. | 6,239,463 | B1 | 5/2001 | Williams et al. |
| 5,943,581 | A | 8/1999 | Lu et al. | 6,239,464 | B1 | 5/2001 | Tsuchitani et al. |
| 5,945,708 | A | 8/1999 | Tihanyi | 6,265,269 | B1 | 7/2001 | Chen et al. |
| 5,949,104 | A | 9/1999 | D'Anna et al. | 6,271,082 | B1 | 8/2001 | Hou et al. |
| 5,949,124 | A | 9/1999 | Hadizad et al. | 6,271,100 | B1 | 8/2001 | Ballantine et al. |
| 5,959,324 | A | 9/1999 | Kohyama | 6,271,552 | B1 | 8/2001 | D'Anna |
| 5,960,271 | A | 9/1999 | Wollesen et al. | 6,271,562 | B1 | 8/2001 | Deboy et al. |
| 5,972,741 | A | 10/1999 | Kubo et al. | 6,274,904 | B1 | 8/2001 | Tihanyi |
| 5,973,360 | A | 10/1999 | Tihanyi | 6,274,905 | B1 | 8/2001 | Mo |
| 5,973,367 | A | 10/1999 | Williams | 6,277,706 | B1 | 8/2001 | Ishikawa |
| 5,976,936 | A | 11/1999 | Miyajima et al. | 6,281,547 | B1 | 8/2001 | So et al. |
| 5,977,591 | A | 11/1999 | Fratin et al. | 6,285,060 | B1 | 9/2001 | Korec et al. |
| 5,981,344 | A | 11/1999 | Hshieh et al. | 6,291,298 | B1 | 9/2001 | Williams et al. |
| 5,981,996 | A | 11/1999 | Fujishima | 6,291,856 | B1 | 9/2001 | Miyasaka et al. |
| 5,998,833 | A | 12/1999 | Baliga | 6,294,818 | B1 | 9/2001 | Fujihira |
| 6,005,271 | A | 12/1999 | Hshieh | 6,297,534 | B1 | 10/2001 | Kawaguchi et al. |
| 6,008,097 | A | 12/1999 | Yoon et al. | 6,303,969 | B1 | 10/2001 | Tan |
| 6,011,298 | A | 1/2000 | Blanchard | 6,307,246 | B1 | 10/2001 | Nitts et al. |
| 6,015,727 | A | 1/2000 | Wanlass | 6,309,920 | B1 | 10/2001 | Laska et al. |
| 6,020,250 | A | 2/2000 | Kenney et al. | 6,313,482 | B1 | 11/2001 | Baliga |
| 6,034,415 | A | 3/2000 | Johnson et al. | 6,316,806 | B1 | 11/2001 | Mo |
| 6,037,202 | A | 3/2000 | Witek | 6,326,656 | B1 | 12/2001 | Tihanyi |
| 6,037,628 | A | 3/2000 | Huang | 6,337,499 | B1 | 1/2002 | Werner |
| 6,037,632 | A | 3/2000 | Omura et al. | 6,346,464 | B1 | 2/2002 | Takeda et al. |
| 6,040,600 | A | 3/2000 | Uenishi et al. | 6,346,469 | B1 | 2/2002 | Greer |
| 6,048,772 | A | 4/2000 | D'Anna | 6,351,018 | B1 | 2/2002 | Sapp |
| 6,049,108 | A | 4/2000 | Williams et al. | 6,353,252 | B1 | 3/2002 | Yasuhara et al. |
| 6,051,488 | A | 4/2000 | Lee et al. | 6,359,308 | B1 | 3/2002 | Hijzen et al. |
| 6,057,558 | A | 5/2000 | Yamamoto et al. | 6,362,112 | B1 | 3/2002 | Hamerski |
| 6,063,678 | A | 5/2000 | D'Anna | 6,362,505 | B1 | 3/2002 | Tihanyi |
| 6,064,088 | A | 5/2000 | D'Anna | 6,365,462 | B2 | 4/2002 | Baliga |
| 6,066,878 | A | 5/2000 | Neilson | 6,365,930 | B1 | 4/2002 | Schillaci et al. |
| 6,069,043 | A | 5/2000 | Floyd et al. | 6,368,920 | B1 | 4/2002 | Beasom |
| 6,077,733 | A | 6/2000 | Chen et al. | 6,368,921 | B1 | 4/2002 | Hijzen et al. |
| 6,081,009 | A | 6/2000 | Neilson | 6,376,314 | B1 | 4/2002 | Jerred |
| 6,084,264 | A | 7/2000 | Darwish | 6,376,315 | B1 | 4/2002 | Hshieh et al. |
| 6,084,268 | A | 7/2000 | de Fresart et al. | 6,376,878 | B1 | 4/2002 | Kocon |
| 6,087,232 | A | 7/2000 | Kim et al. | 6,376,890 | B1 | 4/2002 | Tihanyi |
| 6,096,608 | A | 8/2000 | Williams | 6,384,456 | B1 | 5/2002 | Tihanyi |
| 6,097,063 | A | 8/2000 | Fujihira | 6,388,286 | B1 | 5/2002 | Baliga |
| 6,103,578 | A | 8/2000 | Uenishi et al. | 6,388,287 | B2 | 5/2002 | Deboy et al. |
| 6,103,619 | A | 8/2000 | Lai | 6,400,003 | B1 | 6/2002 | Huang |
| 6,104,043 | A | 8/2000 | Hermansson et al. | 6,426,260 | B1 | 7/2002 | Hshieh |
| 6,104,054 | A | 8/2000 | Corsi et al. | 6,429,481 | B1 | 8/2002 | Mo et al. |
| 6,110,799 | A | 8/2000 | Huang | 6,433,385 | B1 | 8/2002 | Kocon et al. |
| 6,114,727 | A | 9/2000 | Ogura et al. | 6,436,779 | B2 | 8/2002 | Hurkx et al. |
| 6,137,152 | A | 10/2000 | Wu | 6,437,399 | B1 | 8/2002 | Huang |
| 6,150,697 | A | 11/2000 | Teshigahara et al. | 6,441,454 | B2 | 8/2002 | Hijzen et al. |
| 6,156,606 | A | 12/2000 | Michaelis | 6,444,574 | B1 | 9/2002 | Chu |
| 6,156,611 | A | 12/2000 | Lan et al. | 6,452,230 | B1 | 9/2002 | Boden, Jr. |
| 6,163,052 | A | 12/2000 | Liu et al. | 6,459,122 | B2 | 10/2002 | Uno |
| 6,165,870 | A | 12/2000 | Shim et al. | 6,461,918 | B1 | 10/2002 | Calafut |
| 6,168,983 | B1 | 1/2001 | Rumennik et al. | 6,465,304 | B1 | 10/2002 | Blanchard |
| 6,168,996 | B1 | 1/2001 | Numazawa et al. | 6,465,843 | B1 | 10/2002 | Hirler et al. |
| 6,171,935 | B1 | 1/2001 | Nance et al. | 6,465,869 | B2 | 10/2002 | Ahlers et al. |
| 6,174,769 | B1 | 1/2001 | Lou | 6,472,678 | B1 | 10/2002 | Hshieh et al. |
| 6,174,773 | B1 | 1/2001 | Fujishima | 6,472,708 | B1 | 10/2002 | Hshieh et al. |
| 6,174,785 | B1 | 1/2001 | Parekh et al. | 6,475,884 | B2 | 11/2002 | Hshieh et al. |
| 6,184,545 | B1 | 2/2001 | Werner et al. | 6,476,443 | B1 | 11/2002 | Kinzer |
| 6,184,555 | B1 | 2/2001 | Tihanyi et al. | 6,479,352 | B2 | 11/2002 | Blanchard |
| 6,188,104 | B1 | 2/2001 | Choi et al. | 6,489,652 | B1 | 12/2002 | Jeon et al. |

| | | | |
|---|---|---|---|
| 6,501,146 B1 | 12/2002 | Harada | |
| 6,509,240 B2 | 1/2003 | Ren et al. | |
| 6,518,127 B2 | 2/2003 | Hsieh et al. | |
| 6,524,900 B2 | 2/2003 | Dahlqvist et al. | |
| 6,534,825 B2 | 3/2003 | Calafut | |
| 6,566,804 B1 | 5/2003 | Trujillo et al. | |
| 6,573,128 B1 | 6/2003 | Singh | |
| 6,580,123 B2 | 6/2003 | Thapar | |
| 6,608,350 B2 | 8/2003 | Kinzer et al. | |
| 6,621,107 B2 | 9/2003 | Blanchard et al. | |
| 6,627,949 B2 | 9/2003 | Blanchard | |
| 6,635,534 B2 | 10/2003 | Madson | |
| 6,653,691 B2 | 11/2003 | Baliga | |
| 6,657,254 B2 | 12/2003 | Hshieh et al. | |
| 6,677,641 B2 | 1/2004 | Kocon | |
| 6,677,643 B2 | 1/2004 | Iwamoto et al. | |
| 6,683,346 B2 | 1/2004 | Zeng | |
| 6,689,662 B2 | 2/2004 | Blanchard | |
| 6,713,813 B2 | 3/2004 | Marchant | |
| 6,720,616 B2 | 4/2004 | Hirler et al. | |
| 6,724,042 B2 | 4/2004 | Onishi et al. | |
| 6,734,066 B2 | 5/2004 | Lin et al. | |
| 6,750,508 B2 | 6/2004 | Omura et al. | |
| 6,756,636 B2 | 6/2004 | Onishi et al. | |
| 6,762,127 B2 | 7/2004 | Boiteux et al. | |
| 6,806,533 B2 | 10/2004 | Henninger et al. | |
| 6,821,824 B2 | 11/2004 | Minato et al. | |
| 6,833,584 B2 | 12/2004 | Henninger et al. | |
| 6,833,585 B2 | 12/2004 | Kim | |
| 6,861,723 B2 | 3/2005 | Willmeroth | |
| 6,878,994 B2 | 4/2005 | Thapar | |
| 6,890,552 B2 | 5/2005 | Marchant | |
| 6,891,223 B2 | 5/2005 | Krumrey et al. | |
| 6,897,133 B2 | 5/2005 | Collard | |
| 6,921,939 B2 | 7/2005 | Zeng | |
| 7,005,351 B2 | 2/2006 | Henninger et al. | |
| 7,033,876 B2 | 4/2006 | Darwish et al. | |
| 7,091,573 B2 | 8/2006 | Hirler et al. | |
| 7,319,256 B1 | 1/2008 | Kraft et al. | |
| 7,453,119 B2 * | 11/2008 | Bhalla et al. | 257/330 |
| 2004/0232407 A1 | 11/2004 | Calafut | |
| 2005/0017293 A1 | 1/2005 | Zundel et al. | |
| 2005/0167695 A1 | 8/2005 | Yilmaz | |
| 2005/0167742 A1 | 8/2005 | Challa et al. | |
| 2006/0281249 A1 | 12/2006 | Yilmaz et al. | |
| 2007/0037327 A1 | 2/2007 | Herrick et al. | |

FOREIGN PATENT DOCUMENTS

| | | |
|---|---|---|
| DE | 4300806 | 12/1993 |
| DE | 19736981 | 8/1998 |
| DE | 102414160 | 10/2003 |
| DE | 102004057235 | 6/2006 |
| EP | 133642 | 3/1985 |
| EP | 288739 | 11/1988 |
| EP | 292782 | 11/1988 |
| EP | 345380 | 12/1989 |
| EP | 975024 | 1/2000 |
| EP | 1026749 | 9/2000 |
| EP | 1054451 | 11/2000 |
| EP | 1170803 | 1/2002 |
| EP | 747967 | 2/2002 |
| EP | 1205980 | 5/2002 |
| JP | 56-058267 | 5/1981 |
| JP | 62-069562 | 3/1987 |
| JP | 63-188475 | 8/1988 |
| JP | 63-288047 | 11/1988 |
| JP | 63-296282 | 12/1988 |
| JP | 64-022051 | 1/1989 |
| JP | 2000-040872 | 2/2000 |
| JP | 2000-156978 | 6/2000 |
| JP | 2000-277726 | 10/2000 |
| JP | 2000-277728 | 10/2000 |
| JP | 2001-015448 | 1/2001 |
| JP | 2001-015752 | 1/2001 |
| JP | 2001-102577 | 4/2001 |
| JP | 2001-111041 | 4/2001 |
| JP | 2001-135819 | 5/2001 |
| JP | 2001-144292 | 5/2001 |
| JP | 2001-192174 | 7/2001 |
| JP | 2001-244461 | 9/2001 |
| JP | 2001-313391 | 11/2001 |
| JP | 2002-040822 | 2/2002 |
| JP | 2002-083976 | 3/2002 |
| JP | 2005-226638 | 8/2005 |
| WO | 00/33386 | 6/2000 |
| WO | 00/66997 | 11/2000 |
| WO | 00/68998 | 11/2000 |
| WO | 00/75965 | 12/2000 |
| WO | 0101644 | 1/2001 |
| WO | 0106550 | 1/2001 |
| WO | 0106557 | 1/2001 |
| WO | 01/45155 | 6/2001 |
| WO | 01/59847 | 8/2001 |
| WO | 01/71815 | 9/2001 |
| WO | 0195385 | 12/2001 |
| WO | 0195398 | 12/2001 |
| WO | 0213257 | 2/2002 |
| WO | 0247171 | 6/2002 |
| WO | 2004019380 | 3/2004 |
| WO | 2006127914 | 11/2006 |

OTHER PUBLICATIONS

"IR develops CoolMOS—Equivalent Technology, Positions it at the top of a 3-Tiered Line of New Products for SMPS," International Rectifiers Company Information Available at http://www.irf.com, 3 pages total, (1999).

Bai et al. "Novel Automated Optimization of Power MOSFET for 12V Input, High-Frequency DC-DC Converter," International Symposium on Power Semiconductors and Ices, Technical Digest, (2003), pp. 366-369.

Baliga "New Concepts in Power Rectifiers." Physics of Semiconductor Devices, Proceedings of the Third Int'l Workshop, Madras (India). Committee on Science and Technology in Developing Countries, pp. 471-481(1985).

Baliga "Options for CVD of Dielectrics Include Low-k Materials." Technical Literature from Semiconductor International 4 pages total, Jun. 1998.

Baliga et al. "Improving the Reverse Recovery of Power MOSFET Integral Diodes by Electron Irradiation," Solid State Electronics, vol. 26, No. 12, pp. 1133-1141, Dec. 1983.

Brown et al. Novel Trench Gate Structure Developments Set the Benchmark for Next Generation Power MOSFET Switching Performance. Power Electronics—Proceedings (PCIM), Nurenburg, Vo.47. pp. 275-278, May 2003.

Bulucea "Trench DMOS Transistor Technology for High Current (100 A Range) Switching" Solid-State Electronics vol. 34 pp. 493-507 (1991).

Chang et al. Numerical and Experimental Analysis of 500-V Power DMOSFET with an Atomic-Lattice Layout IEEE Transactions on Electron Devices 36:2623 (1989).

Chang et al. "Self-Aligned UMOSFET's with a Specific On-Resistance of 1mQ cm2," IEEE Transactions on Electron Devices 34:2329-2334(1987).

Cheng et al. "Fast Reverse Recovery Body Diode in High-Voltage VDMOSFET Using Cell-Distributed Schottky Contacts," IEEE Transactions on Electron Devices, vol. 50, No. 5, pp. 1422-1425, May 2003.

Curtis et al. "APCVD TEOS: 03 Advanced Trench Isolation Applications," Semiconductor Fabtech 9th Edition, 8 pages total, (1999).

Darwish et al. "A New Power W-Gated Trench MOSFET (WMOSFET) with High Switching Performance." ISPSD Proceedings—Cambridge, 4 pages total, Apr. 2003.

Djekic, O et al. "High Frequency Synchronous Buck Converter for Low Voltage Applications," Proc. IEEE Power Electronics Specialist Conf. (PESC), pp. 1248-1254, (1998).

Fujihira "Theory of Semiconductor Super Junction Devices," Jpn. J. Appl. Phys. vol. 36 pp. 6254-6262 (1997).

Gan et al. "Poly Flanked VDMOS (PFVDMOS): A Superior Technology for Super Junction Devices." IEEE Power Electronics Specialists Conf., Jun. 17-22, 2001, Vancouver, Canada, 4 pages total, (2001).

Glenn et al. "A Novel Vertical Deep Trench RESURF DMOS (VTR-DMOS)" IEEE ISPD, pp. 197-200, Toulouse France, May 22-25, 2000.

Kao et al. "Two Dimensional Thermal Oxidation of Silicon-1. Experiments." IEEE Transactions on Electron Devices, vol. ED-34 No. 5, pp. 1008-1017, May 1987.

Kao et al. "Two Dimensional Thermal Oxidation of Silicon-II Modeling Stress Effects in Wet Oxides." IEEE Transactions on Electron Devices, vol. ED-35 No. 1, pp. 25-37, Jan. 1988.

Kassakian, J.G. et al. "High-Frequency High-Density Converters for Distributed Power Supply Systems," Proc. of the IEEE, vol. 76, No. 4, pp. 362-376, (Apr. 1988).

Korman, C.S. et al. "High Performance Power DMOSFET With Integrated Schottky Diode," Proc. Idée Power Electronics Specialist Conf. (PESC), pp. 176-179, (1989).

Lorenz et al. "Cool MOS—An Important Milestone Towards a New Power MOSFET Generation" Power Conversion pp. 151-160 (1988).

Maksimovic, A.M. et al. "Modeling and Simulation of Power Electronic Converters," Proc. of the IEEE, vol. 89, No. 6, pp. 898-912, (Jun. 2001).

Mehrotra, M. et al. "Very Low Forward Drop JBS Rectifiers Fabricated Using Submicron Technology," IEEE Transactions on Electron Devices, vol. 40, No. 11, pp. 2131-2132, (Nov. 1993).

Miller, "Power Management & Supply—Market, Applications Technologies—an Overview," Infineon Technologies, http://www.ewh.ieee.org/r8.germany/ias-pels/m_regensburg/overview_miller.pdf, 53 pages total, available as early as (May 5, 2003).

Moghadam "Delivering Value Around New Industry Paradigms," Technical Literature From Applied Materials, vol. 1, Issue 2, pp. 1-11, Nov. 1999.

Park et al. "Lateral Trench Gate Super-Junction SOI-LDMOSFETs With Low On-Resistance," Institute for Microelctronics, University of Technology Vienna, Austria, pp. 283-285, (2002).

Sakai et al. "Experimental Investigation of Dependence of Electrical Characteristics of Device Parameters in Trench MOS Barrier, Schottky Diodes," International Symposium on Power Semiconductors and ICs, Technical Digest, pp. 293-296, (1998).

Shenai et al. "Current Transport Mechanisms in Automatically Abrupt Metal-Semiconductor Interfaces," IEEE Transactions on Electron Devices, vol. 35, No. 4, pp. 468-482, (Apr. 1988).

Shenai et al. "Monolithically Integrated Power MOSFET and Schottky Diodes with Improved Reverse Recovery Characteristics," IEEE Transactions on Electron Devices, vol. 37, No. 4, pp. 1167-1169, (Apr. 1990).

Shenoy et al. "Analysis of the Effect of Change Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al. "A MOSFET Resonant Synchronous Rectifier for High-Frequency DC/DC Converters," Proc. IEEE Power Electronics Specialist Conf. (PESC), pp. 769-779, (1990).

Technical Literature From Quester Technology, Model APT-4300 300mm Atmospheric TEOS/Ozone CVD System, 2 pages total, (unknown date).

Technical Literature From Quester Technology, Model APT-6000 Atmospheric TEOS/Ozone CVD System, 4 pages total (unknown date).

Technical Literature From Silicon Valley Group Thermal Systems, APNext, High Throughput APCVD Cluster Tool for 200mm/300mm Wafer Processing, 2 pages total (unknown date).

Tu et al. "On the Reverse Blocking Characteristics of Schottky Power Diodes," IEEE Transactions on Electron Devices, vol. 39, No. 12, pp. 2813-2814, (Dec. 1992).

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf "Silicon Processing for the VLSI Era" vol. 2 Process Integration Lattice Press, 3 pages total, (1990).

Yamashita et al. Conduction Power Loss in MOSFET Synchronous Rectifier With Parallel-Connected Schottky Barrier Diode, IEEE Transactions on Power Electronics, vol. 13, No. 4, pp. 667-673, (Jul. 1998).

PCT, Written Opinion of the International Searching Authority for Application No. PCT/US2007/069329, May 14, 2008.

PCT, International Search Report of the International Searching Authority for Application No. PCT/US2007/069329, May 14, 2008.

Baliga, B.J., "Analysis of a High-Voltage Merged p-i-n/Schottky (MPS) Rectifier," IEEE Electron Device Letters, 8 (9):407-409 (1987).

Chelnokov et al., "Silicon Carbide p-n Structures as Power Rectifiers," Proc. of the 6th International Symposium on Power Semiconductor Devices and Ices, pp. 253-256 (1994).

Konstantinov et al., "Ionization Rates and Critical Fields in 4H Silicon Carbide," Applied Phys. :Letters, 71 (1):90-92 (1997).

Meunch et al., "Breakdown Field in Vapor-Grown Silicon Carbide p-n Junctions," J. Applied Physics, 48(11) (1977).

Morisette et al., "Theoretical Comparison of SiC PiN and Schottky Diodes Based on Power Dissipation Considerations," IEEE Trans. Electron Devices, 49(9):1657-1664 (2002).

Saitoh et al., Origin of Leakage Current in SiC Schottky Barrier Diodes at High Temperature, Material Science Forum, vols. 457-460, pp. 997-1000 (2004).

Sankin et al., "Power SiC MOSFETs," Book Chapter From Advances in Silicon Carbide Processing and Applications, Saddow et al., eds., (2004).

Vasilevskki et al., "Experimental Determination of Electron Drift Velocity in 4F-SiC p+ -n-n+ Avalanche Diodes," IEEE Electron Device Letters, 21(10):485-487 (Oct. 2000).

Wolf "Silicon Processing for the VLSI Era" vol. 1 Process Technology, Second Edition, pp. 658, (1990).

Xu et al., "Dummy Gated Radio Frequency VDMOSFET With High Breakdown Voltage and Low Feedback Capacitance," Pro. of 12th International Symposium on Power Semiconductor Devices & ICS (ISPSD'2000), Toulouse, France, May 22-25, 2000, pp. 385-388, XP002200791, IEEE, Piscataway, NJ, USA, ISBN 0-7803-6269-1.

Yuan et al., "Experimental Demonstration of a Silicon Carbide IMPATT Oscillator," IEEE Electron Device Letters, 22 (6);266-268 (2001).

Supplemental Notice of Allowance Mailed Apr. 10, 2007 in U.S. Appl. No. 11/471,279.

Notice of Allowance Mailed Apr. 26, 2007 in U.S. Appl. No. 11/471,279.

Notice of Allowance Mailed Aug. 10, 2007 in U.S. Appl. No. 11/471,279.

Supplemental Notice of Allowance Mailed Sep. 20, 2007 in U.S. Appl. No. 11/471,279.

Supplemental Notice of Allowance Mailed Sep. 26, 2007 in U.S. Appl. No. 11/471,279.

* cited by examiner

SHIELDED GATE TRENCH FET WITH THE SHIELD AND GATE ELECTRODES CONNECTED TOGETHER IN NON-ACTIVE REGION

CROSS-REFERENCES TO RELATED APPLICATIONS

This application is a continuation of U.S. application Ser. No. 11/938,583, filed Nov. 12, 2007, which is a division of U.S. application Ser. No. 11/471,279, filed Jun. 19, 2006, now U.S. Pat. No. 7,319,256, the disclosures of which are incorporated herein by reference in their entirety for all purposes.

BACKGROUND OF THE INVENTION

The present invention relates in general to semiconductor power field effect transistors (FETs) and in particular to shielded gate trench FETs with their shield and gate electrodes connected together.

Shielded gate trench FETs are advantageous over conventional FETs in that the shield electrode reduces the gate-drain capacitance (Cgd) and improves the breakdown voltage of the transistor. FIG. 1 is a simplified cross sectional view of a conventional shielded gate trench MOSFET. An n-type epitaxial layer 102 extends over n+ substrate 100. N+ source regions 108 and p+ heavy body regions 106 are formed in a p-type body region 104 which is in turn formed in epitaxial layer 102. Trench 110 extends through body region 104 and terminates in the drift region. Trench 110 includes a shield electrode 114 below a gate electrode 122. Gate electrode 122 is insulated from its adjacent silicon regions by gate dielectric 120, and Shield electrode 114 is insulated from its adjacent silicon regions by a shield dielectric 112 which is thicker than gate dielectric 120.

The gate and shield electrodes are insulated from one another by a dielectric layer 116 also referred to as inter-electrode dielectric or IED. IED layer 116 must be of sufficient quality and thickness to support the potential difference that may exist between shield electrode 114 and gate electrode 122. In addition, interface trap charges and dielectric trap charges in IED layer 116 or at the interface between the shield electrode 114 and IED layer 116 are associated primarily with the methods for forming the IED layer.

The IED is typically formed by various processing methods. However, insuring a high-quality IED that is sufficiently robust and reliable enough to provide the required electrical characteristics results in complicated processes for forming the shielded gate trench FET. Accordingly, there is a need for structure and method of forming shielded gate trench FET that eliminate the need for a high-quality IED while maintaining or improving such electrical characteristics as on-resistance.

BRIEF SUMMARY OF THE INVENTION

According to an embodiment of the invention, a field effect transistor (FET) includes a plurality of trenches extending into a semiconductor region. Each trench includes a gate electrode and a shield electrode with an inter-electrode dielectric therebetween. A body region extends between each pair of adjacent trenches, and source regions extend in each body region adjacent to the trenches. A first interconnect layer contacts the source and body regions. The plurality of trenches extend in an active region of the FET, and the shield electrode and gate electrode extend out of each trench and into a non-active region of the FET where the shield electrodes and gate electrodes are electrically connected together by a second interconnect layer. The electrical connection between the shield and gate electrodes is made through periodic contact openings formed in a gate runner region of the non-active region.

In one embodiment, the FET of claim further includes a substrate and a drift region bounded by the body regions and the substrate, and the plurality of trenches terminate within the drift region. In another embodiment, the plurality of trenches extends through the drift region and terminate within the substrate.

In yet another embodiment, the shield electrode and the gate electrode in each trench are electrically connected together by an additional connection through the IED in each trench.

In still another embodiment, the first interconnect layer is a source interconnect layer and the second interconnect layer is a gate interconnect layer.

DETAILED DESCRIPTION OF THE INVENTION

FIGS. 2A-2H are simplified cross sectional views at various steps of a process for forming a shielded gate trench FET according to an embodiment of the invention. In FIGS. 2A-2H, the left cross section views depict the sequence of steps leading to formation of the shield gate trench FET structure in the active region, and the right cross section views depict corresponding views of a transition region from active region to non-active region (from right to left). In this disclosure, "active region" represents areas of a die housing the active cells, and "non-active region" represents areas of the die which do not include any active cells. The non-active region includes the termination region extending along the perimeter of the die and the gate runners extending along the perimeter or middle of the die or along both the perimeter and middle of the die.

Figure 1:
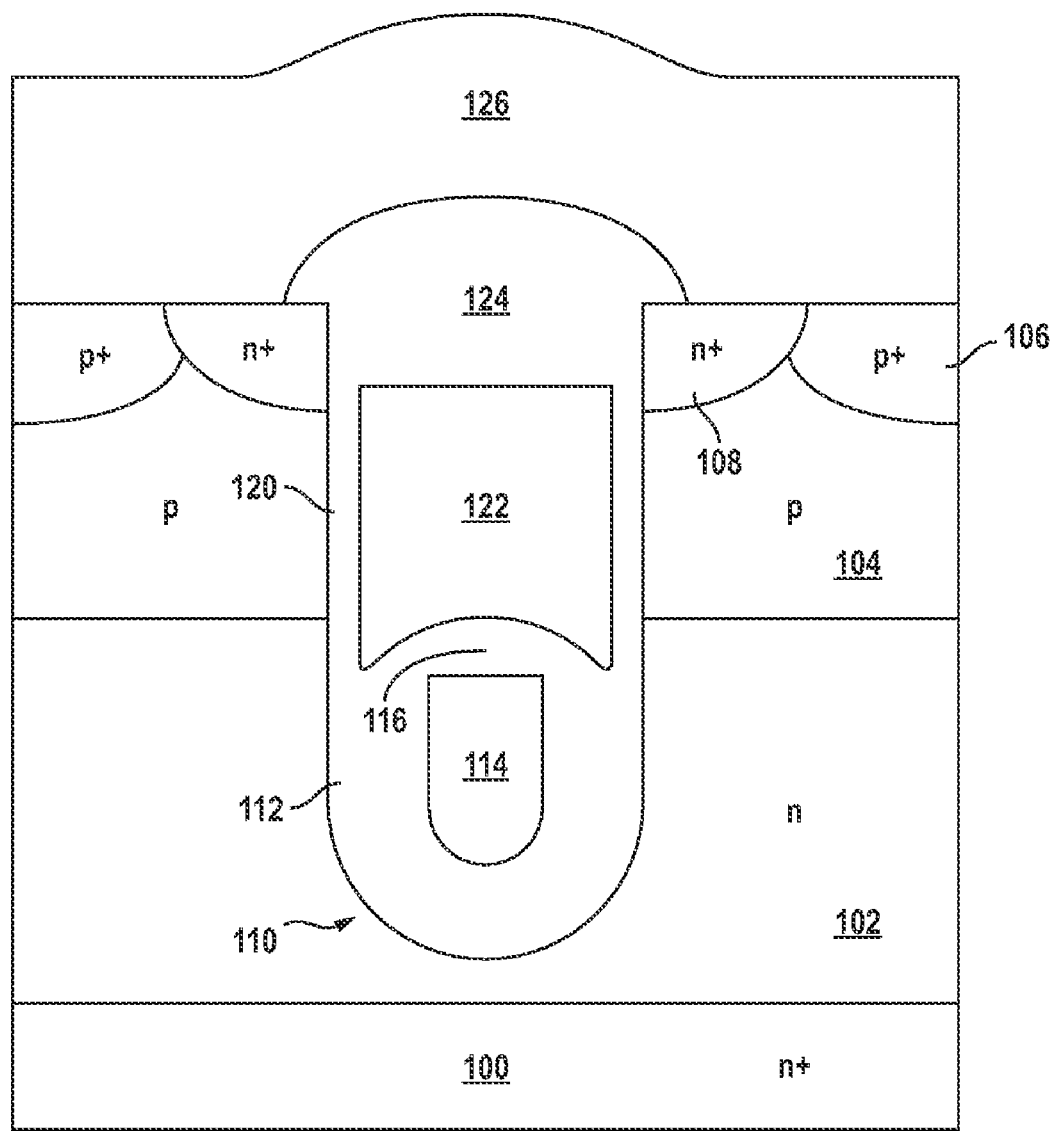
FIG. 1 is a cross sectional view of a conventional shielded gate trench MOSFET.
Figure 2A:
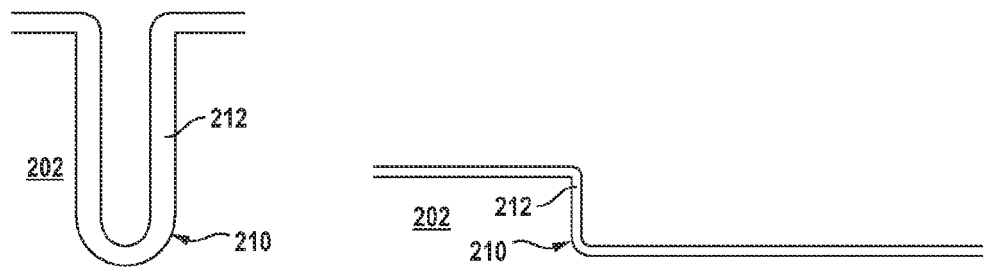
FIGS. 2A-2H are simplified cross sectional views at various steps of a process for forming a shielded gate trench FET according to an embodiment of the invention.

In FIG. 2A, using conventional techniques, trench 210 is formed in a semiconductor region 202, and then a shield dielectric 212 (e.g., comprising oxide) is formed lining the trench sidewalls and bottom surface and extending over mesa regions adjacent the trench. The right cross section view in each of FIGS. 2A-2H is through the center of the trench in the left cross section view, along a dimension perpendicular to the left cross section view. Thus, the right cross section view shows the trench of the left cross section view terminating at the edge of the active region. Also, the cross section views are not to scale, and in particular, the physical dimensions (e.g., thickness) of the same layers or regions in the right and the left cross section views may not appear the same. For example, in FIG. 2A, shield dielectric 212 appears thinner in the right cross section view than the left.

As shown in the right cross section view of FIG. 2A, shield dielectric 212 extends along the bottom surface of trench 210, and at the edge of the active region, extends up and out of trench 210 and over silicon region 202. In one embodiment semiconductor region 202 includes an n-type epitaxial layer (not shown) formed over a highly doped n-type substrate (not shown), and trench 202 extends into and terminates within epitaxial layer. In another variation, trench 202 extends through the epitaxial layer and terminates within the substrate.

Figure 2B:
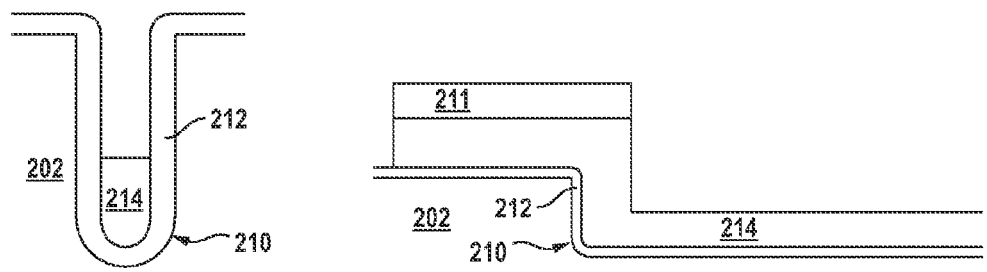

In FIG. 2B, shield electrode 214 is formed along a bottom portion of trench 210 and is made electrically accessible in the non-active region of the die, as follows. Using known techniques, a conductive material (e.g., comprising doped or undoped polysilicon) is first formed filling the trench and extending over the mesa regions, and subsequently recessed deep into trench 210 to form shield electrode 214.

During recessing of the conductive material, a mask 211 is used to protect portions of the conductive material extending in the non-active region of the die. As a result, shield electrode 214 is thicker inside trench 210 than over the mesa surfaces in the non-active region of the die, as depicted in the right cross section view in FIG. 2B. Further mask 211 is applied such that, at the edge of the active region, the shield electrode extends out of trench 210 and over the mesa surface of the non-active region. Shield electrode 214 inside trench 210 is thus made available for electrical connectivity in the non-active region of the die.

Figure 2C:
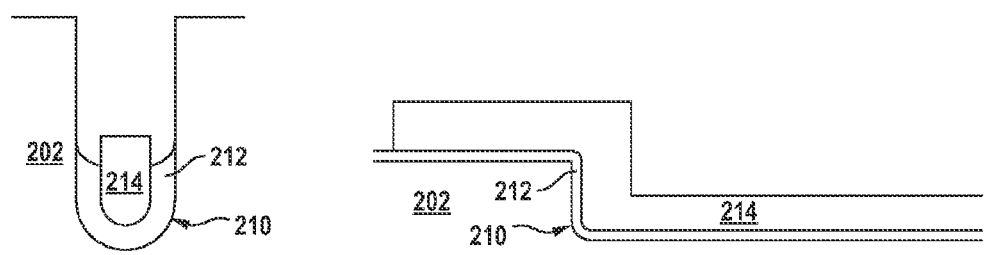

In FIG. 2C, using known methods, shield dielectric 212 is completely removed from along trench sidewalls and over mesa surfaces in the active region, as depicted by the right cross section view. The shield dielectric is thus recessed below the top surface of shield electrode 214. In one embodiment, shield electrode 214 is recessed so that its top surface becomes co-planar with that of the shield dielectric layer 212. This provides a planar surface for the subsequent formation of gate/inter-electrode dielectric layer.

Figure 2D:
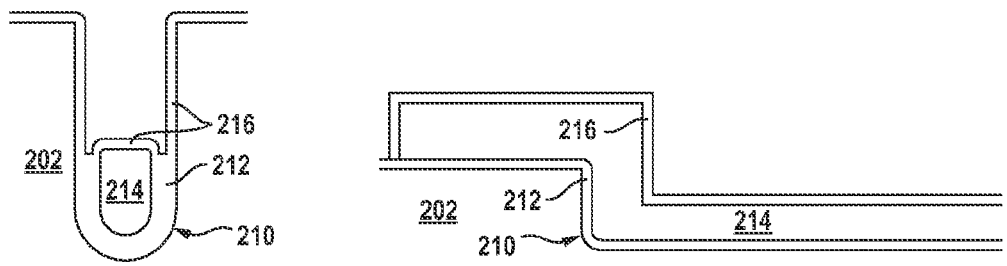

In FIG. 2D, a gate dielectric layer 216 extending along upper trench sidewalls is formed using conventional techniques. In one embodiment, gate dielectric 216 is formed using conventional oxidation of silicon. This process also results in oxidation of shield electrode 214 thus forming an inter-electrode dielectric (IED) layer over gate electrode 214. As shown in the right cross section view, dielectric layer 216 extends along all exposed surfaces of the shield electrode 214 in the active and non-active regions. As further discussed below, the additional process steps typically required for forming a high-quality IED are eliminated.

Figure 2E:
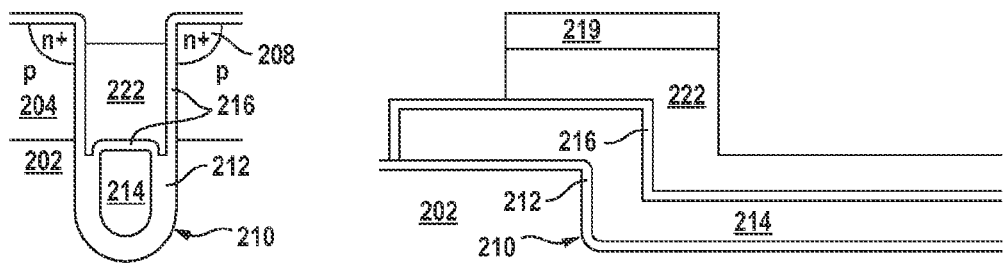

In FIG. 2E, recessed gate electrode 222 is formed in trench 210 and is made electrically accessible in the non-active region as follows. Using conventional techniques, a second conductive layer (e.g., comprising doped polysilicon) is formed filling trench 210 and extending over the mesa surfaces in the active and non-active regions of the die. The second conductive layer is then recessed into trench 210 to form gate electrode 222.

During recessing of the second conductive layer, a mask 219 is used to protect portions of the second conductive material extending in the non-active region of the die. As a result, gate electrode 222 is thicker inside trench 210 than over the mesa surfaces in the non-active region of the die, as depicted in the right cross section view in FIG. 2B. Further mask 219 is applied such that, at the edge of the active region, the recessed gate electrode 222 extends out of trench 210 and over the mesa surface of the non-active region. Gate electrode 222 inside trench 210 is thus made available for electrical connectivity in the non-active region of the die. Note that mask 219 does not extend over the entire shield electrode 214 in the non-active region. As will be seen, this facilitates contacting both the gate electrode and shield electrode through the same contact opening.

In FIG. 2L, p-type body regions 204 are formed in semiconductor region 202 using conventional body implant and drive in techniques. Highly doped n-type source regions 208 are then formed in body regions 216 adjacent trench 210 using conventional source implant techniques.

Figure 2F:
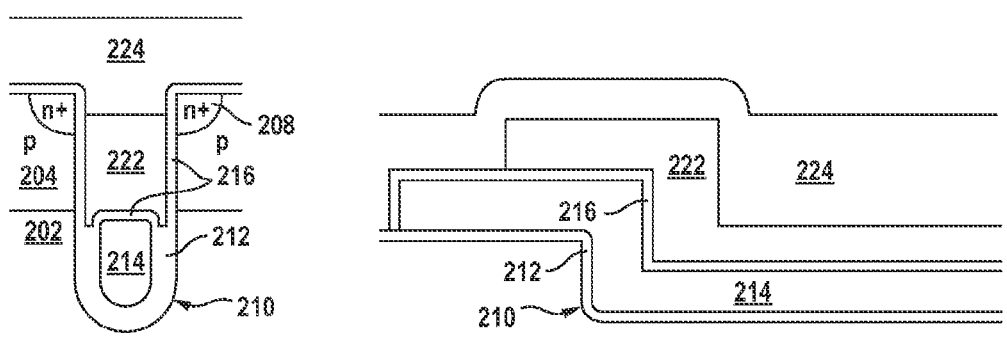
Figure 2G:
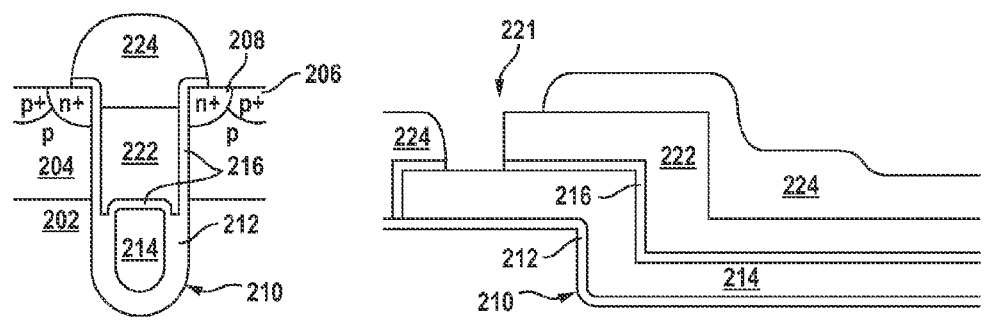

In FIG. 2F, a dielectric layer 224, such as BPSG, is formed over the structure using known techniques. In FIG. 2G, dielectric layer 224 is patterned and etched to form source/body contact openings in the active region, followed by a dielectric flow. As shown in the left cross section, a dielectric dome 225 extending fully over gate electrode 222 and partially over source regions 208 is formed. P-type heavy body regions 206 are then formed in exposed semiconductor regions 202 using conventional implant techniques. The same masking/etching process for forming contact openings in the active region is used to form a contact opening 221 in dielectric layer 224 in the non-active region in order to expose a surface region and sidewall of gate electrode 222 and a surface region of shield electrode 214, as shown in the right cross section view.

Figure 2H:
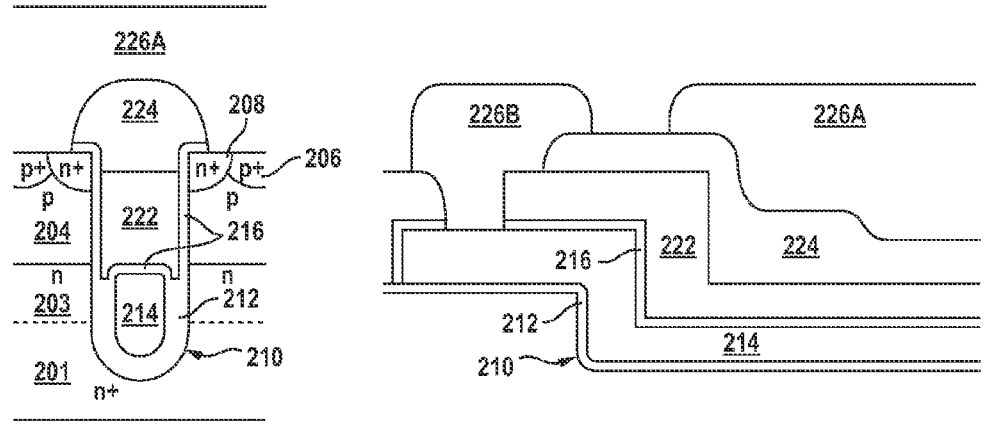

In FIG. 2H, an interconnect layer (e.g., comprising metal) is formed over the structure and then patterned to form source/body interconnect 226A and gate interconnect 226B. As shown in the left cross section view, source/body interconnect 226A contacts source regions 208 and heavy body regions 106 but is insulated from gate electrode 222 by dielectric dome 224. As shown in the right cross section view, gate metal 226B contacts both shield electrode 214 and gate electrode 222 through contact opening 221, thus shorting the two electrodes to one another.

Thus, contrary to conventional shielded gate FETs wherein the shield electrode either floats (i.e., is electrically unbiased) or is biased to the source potential (e.g., ground potential), in the FET embodiment shown in FIG. 2H, the shield electrode is connected and biased to the same potential as the gate electrode. In conventional FETs where the shield electrode is floating or connected to ground potential, a high-quality IED is typically required to support the potential difference between the shield and gate electrodes. However, electrically connecting together the shield and gate electrodes eliminates the need for a high-quality IED. The shield electrode, although biased to the gate potential, still serves as a charge balance structure enabling the reduction of the on resistance for the same breakdown voltage. Thus, a low on-resistance for the same breakdown voltage is obtained while the process steps associated with forming a high quality IED are eliminated. Theoretically, such a structure would not even need an IED, but the IED is formed naturally during the formation of gate dielectric. Thus, a high performance transistor is formed using a simple manufacturing process.

Figure 3:
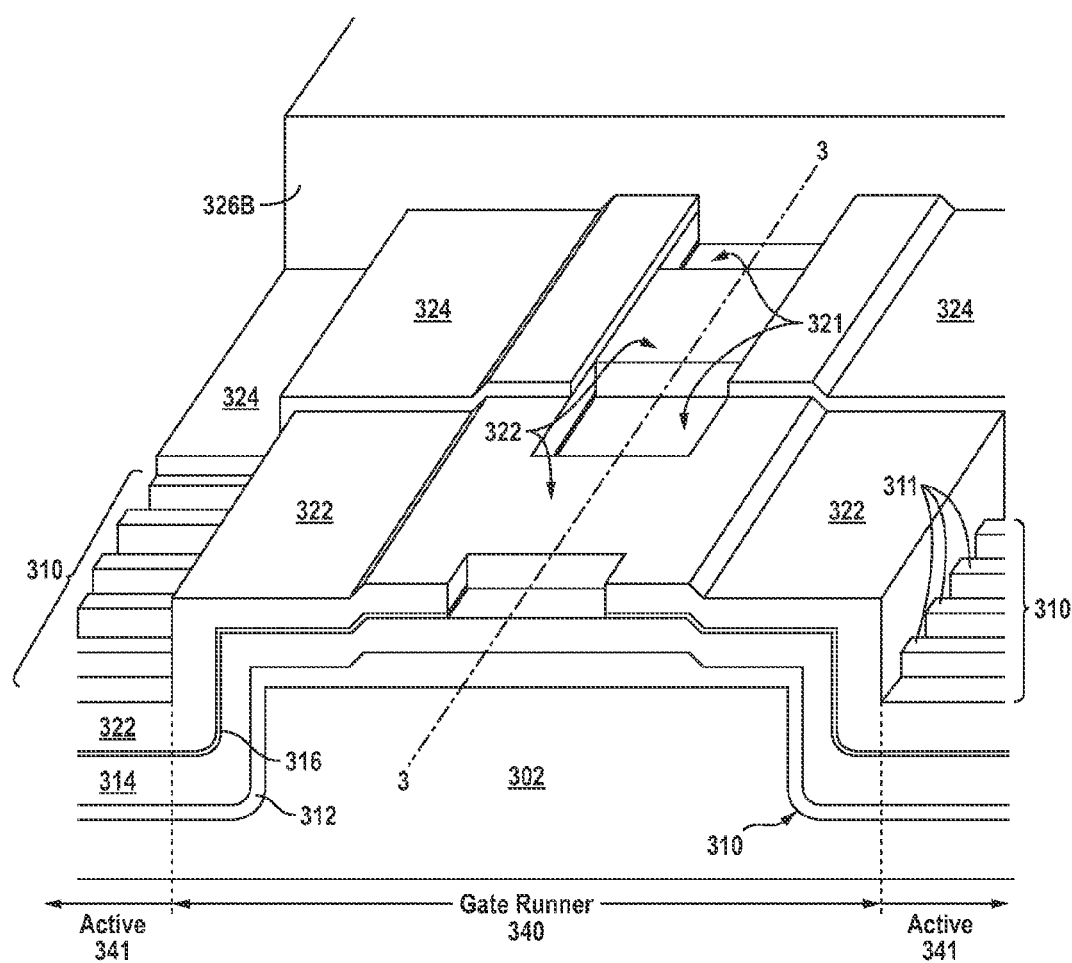
FIG. 3 is an isometric view of a portion of a gate runner in a shielded gate trench FET, according to an embodiment of the invention.

The electrical contact between the gate and shield electrodes may be formed in any non-active region, such as in the termination or edge regions of the die, or in the middle of the die where the gate runners extend as shown in FIG. 3. FIG. 3 is an isometric view of a portion of a gate runner in a shielded gate trench FET, according to an embodiment of the invention. The upper layers (e.g., gate interconnect layer 326B and dielectric layer 324) are peeled back in order to reveal the underlying structures. As shown, trenches 310 extending in parallel in the active region 341 terminate on either side of the gate runner region 340.

The gate runner region 340 is structurally symmetrical about line 3-3, with each half being structurally similar to that shown in FIG. 2H. Shield dielectric 312 extends out of the rows of trenches 310 and onto the mesa surface in gate runner region 340. Likewise, each of shield electrode 314, inter-electrode dielectric 316 and gate electrode 322 extend out of the rows of trenches 310 and onto the mesa surface in gate runner region 340. Regions 311 represent the mesas between adjacent trenches in the active region 341.

Contact openings 321 expose surface areas of shield electrode 314 to which gate interconnect layer 326B (e.g., comprising metal) makes electrical contact. Additionally, gate interconnect layer 326B makes electrical contact with surface areas 332 of gate electrodes 322 exposed through dielectric layer 324. It is desirable to minimize the gate resistance in order to minimize the delay in biasing the individual gate electrodes inside the trenches. For the same reasons, it is desirable to minimize the delay in biasing the individual shield electrodes inside the trenches. Accordingly, the frequency and shape of contact openings 321 in gate runner region 340 can be optimized to minimize the resistance and thus the delay from the gate pad to each of the gate and shield electrodes. The delay in biasing the shield and gate electrodes can be further reduced by forming the gate electrode to shield electrode contacts in both the gate runner regions and in the termination or edge regions of the die.

The shield and gate electrodes may be electrically connected in other ways according to other embodiments of the invention. For example, the IED in each trench may be etched in certain places before forming the gate electrode over the IED. In this embodiment, contact openings as shown in FIGS. 2H and 3 would not be necessary, and a gate interconnect contact to the gate electrode in each trench would also be coupled to the corresponding shield electrode through shorts in the IED. According to the other embodiments, gate and shield electrode contacts may be formed through openings in the IED and through contact openings formed in the non-active regions such as the termination and gate runner regions. The elimination of the need to form a high-quality IED results in a simplified and more controllable process for forming shielded gate trench MOSFETs with improved drain-to-source on-resistance $R_{DSon}$.

The principles of the invention may be applied to any shielded gate FET structures such as those shown in FIGS. 3A, 3B, 4A, 4C, 6-8, 9A-9C, 11, 12, 15, 16, 24 and 26A-26C of patent application Ser. No. 11/026,276, titled "Power Semiconductor Devices and Methods of Manufacture," which disclosure is incorporated herein by reference in its entirety for all purposes.

While the above provides a complete description of the preferred embodiments of the invention, many alternatives, modifications, and equivalents are possible. Those skilled in the art will appreciate that the same techniques can apply to other types of super junction structures as well as more broadly to other kinds of devices including lateral devices. For example, while embodiments of the invention are described in the context of n-channel MOSFETs, the principles of the invention may be applied to p-channel MOSFETs by merely reversing the conductivity type of the various regions. Therefore, the above description should not be taken as limiting the scope of the invention, which is defined by the appended claims.

What is claimed is:

1. A field effect transistor (FET) comprising:
   a plurality of trenches extending into a semiconductor region;
   a shield electrode in a lower portion of each trench, the shield electrode being insulated from the semiconductor region by a shield dielectric;
   an inter-electrode dielectric (IED) over the shield electrode in each trench;
   a body region extending between each pair of adjacent trenches;
   a gate electrode recessed in an upper portion of each trench over the IED, the gate electrode being insulated from corresponding body regions by a gate dielectric;
   source regions in each body region adjacent to the trenches, the source regions having a conductivity type opposite to that of the body regions;
   a first interconnect layer contacting the source and body regions; and
   a dielectric material insulating each gate electrode and the second interconnect layer from one another,
   wherein the plurality of trenches extend in an active region of the FET, the shield electrode and gate electrode extending out of each trench and into a non-active region of the FET where the shield electrodes and gate electrodes are electrically connected together by a second interconnect layer, and the electrical connection between the shield and gate electrodes is made through periodic contact openings formed in a gate runner region of the non-active region.

2. The FET of claim 1 further comprising:
   a substrate; and
   a drift region bounded by the body regions and the substrate, wherein the plurality of trenches terminate within the drift region.

3. The FET of claim 1 further comprising:
   a substrate; and
   a drift region bounded by the body regions and the substrate, wherein the plurality of trenches extend through the drift region and terminate within the substrate.

4. The FET of claim 1 wherein the shield electrode and the gate electrode in each trench are electrically connected together by an additional connection through the IED in each trench.

5. The FET of claim 1 wherein the first interconnect layer is a source interconnect layer, and the second interconnect layer is a gate interconnect layer.

* * * * *